(12) United States Patent
Loechelt

(10) Patent No.: US 8,592,279 B2
(45) Date of Patent: Nov. 26, 2013

(54) ELECTRONIC DEVICE INCLUDING A TAPERED TRENCH AND A CONDUCTIVE STRUCTURE THEREIN AND A PROCESS OF FORMING THE SAME

(75) Inventor: Gary H. Loechelt, Tempe, AZ (US)

(73) Assignee: Semicondcutor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/327,422

(22) Filed: Dec. 15, 2011

(65) Prior Publication Data

US 2013/0153992 A1 Jun. 20, 2013

(51) Int. Cl.
*H01L 21/336* (2006.01)
*H01L 29/66* (2006.01)

(52) U.S. Cl.
USPC .......................... 438/301; 438/299; 257/330

(58) Field of Classification Search
USPC .................. 438/301, 194, 289, 299; 257/402, 257/E21.409, E29.255, 337, 288, E21.616, 257/E27.06
See application file for complete search history.

(56) References Cited

U.S. PATENT DOCUMENTS

| | | | |
|---|---|---|---|
| 5,569,949 A | 10/1996 | Malhi | |
| 5,667,632 A | 9/1997 | Burton et al. | |
| 6,034,409 A | 3/2000 | Sakai et al. | |
| 6,084,268 A | 7/2000 | dr Frésart et al. | |
| 6,501,129 B2 | 12/2002 | Osawa | |
| 6,545,316 B1 | 4/2003 | Baliga | |
| 6,649,975 B2 | 11/2003 | Baliga | |
| 6,977,416 B2 | 12/2005 | Nakazawa et al. | |
| 7,276,747 B2 | 10/2007 | Loechelt et al. | |
| 7,345,342 B2 | 3/2008 | Challa et al. | |
| 7,638,426 B2 | 12/2009 | Kim | |
| 7,847,350 B2 | 12/2010 | Davies | |
| 7,868,379 B2 | 1/2011 | Loechelt | |
| 2002/0132422 A1 | 9/2002 | Ranade et al. | |
| 2003/0073289 A1 | 4/2003 | Curry et al. | |
| 2005/0158964 A1 | 7/2005 | Chiu et al. | |
| 2006/0228880 A1 | 10/2006 | McDaniel et al. | |
| 2008/0001196 A1 | 1/2008 | Cheng et al. | |
| 2008/0157211 A1 | 7/2008 | Wang | |
| 2008/0230787 A1 | 9/2008 | Suzuki et al. | |
| 2009/0096021 A1 | 4/2009 | Loechelt et al. | |
| 2010/0090269 A1 | 4/2010 | Davies | |
| 2010/0148245 A1 | 6/2010 | Loechelt | |

(Continued)

OTHER PUBLICATIONS

Wolf, Stanley et al., "Silicon Processing for the VLSI Era," vol. 1: Process Technology, Copyright 1986 Lattice Press, 1986, 4 pgs.

(Continued)

*Primary Examiner* — N Drew Richards
*Assistant Examiner* — Christina Sylvia
(74) *Attorney, Agent, or Firm* — Abel Law Group, LLP

(57) ABSTRACT

An electronic device can include a semiconductor layer, and a trench extending into the semiconductor layer and having a tapered shape. In an embodiment, the trench includes a wider portion and a narrower portion. The electronic device can include a doped semiconductor region that extends to a narrower portion of the trench and has a dopant concentration greater than a dopant concentration of the semiconductor layer. In another embodiment, the electronic device can include a conductive structure within a relatively narrower portion of the trench, and a conductive electrode within a relatively wider portion of the trench. In another embodiment, a process of forming the electronic device can include forming a sacrificial plug and may allow insulating layers of different thicknesses to be formed within the trench.

5 Claims, 12 Drawing Sheets

(56) References Cited

U.S. PATENT DOCUMENTS

| | | |
|---|---|---|
| 2010/0151646 A1 | 6/2010 | Loechelt |
| 2010/0200912 A1 | 8/2010 | Hsieh |
| 2011/0045664 A1 | 2/2011 | Davies |
| 2011/0193143 A1 | 8/2011 | Loechelt et al. |
| 2011/0193160 A1* | 8/2011 | Loechelt et al. ............... 257/337 |
| 2011/0193177 A1* | 8/2011 | Loechelt ....................... 257/402 |
| 2011/0233606 A1 | 9/2011 | Hsieh |

OTHER PUBLICATIONS

Prasad Venkatraman et al., U.S. Appl. No. 13/327,361, filed Dec. 15, 2011.

Gary H. Loechelt et al., U.S. Appl. No. 13/327,390, filed Dec. 15, 2011.

Gary H. Loechelt et al., U.S. Appl. No. 13/327,454, filed Dec. 15, 2011.

* cited by examiner

ELECTRONIC DEVICE INCLUDING A TAPERED TRENCH AND A CONDUCTIVE STRUCTURE THEREIN AND A PROCESS OF FORMING THE SAME

RELATED APPLICATION

This application is related to U.S. patent application Ser. No. 13/327,454, now allowed, entitled "Electronic Device Including a Tapered Trench with a Facet and a Conductive Structure Therein and a Process of Forming the Same" by Loechelt and Grivna filed of even date, which is assigned to the current assignee hereof and incorporated herein by reference in its entirety.

FIELD OF THE DISCLOSURE

The present disclosure relates to electronic devices and processes of forming electronic devices, and more particularly to, electronic devices including trenches and conductive structures therein and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When a MOSFET is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of a MOSFET, a designer is often faced with trade-offs in device parameter performance. Specifically, available device structure or fabrication process choices may improve one device parameter, but at the same time such choices may degrade one or more other device parameters. For example, available structures and processes that improve on resistance ($R_{DSON}$) of a MOSFET may reduce the breakdown voltage ($BV_{DSS}$) and increase parasitic capacitance between regions within the MOSFET.

BRIEF DESCRIPTION OF THE DRAWINGS

Embodiments are illustrated by way of example and are not limited in the accompanying figures.

Figure 1:
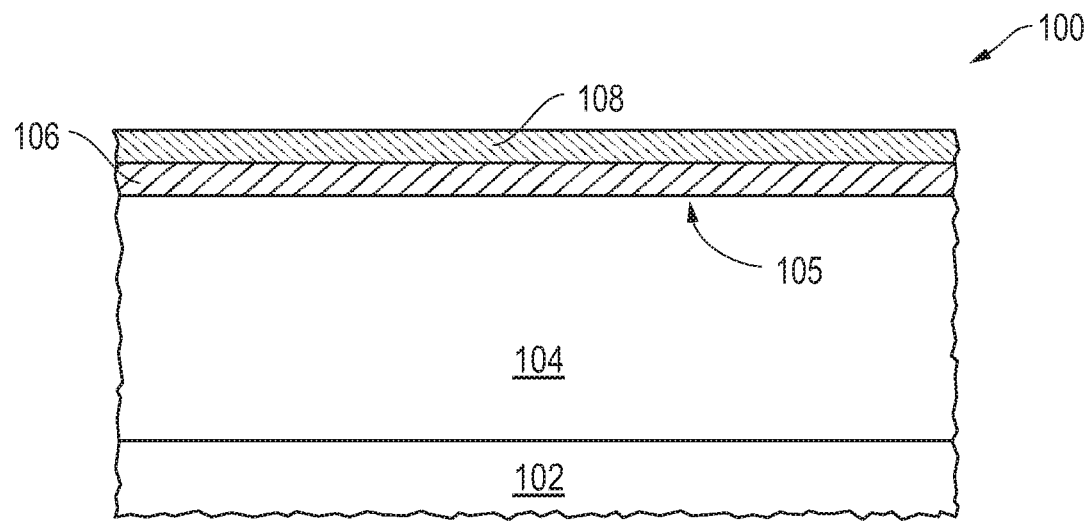
FIG. 1 includes an illustration of a cross-sectional view of a portion of a workpiece that includes an underlying doped region, a semiconductor layer, a pad layer, and a stopping layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

The terms "horizontally-oriented" and "vertically-oriented," with respect to a region or structure, refers to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the CRC Handbook of Chemistry and Physics, $81^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a transistor structure having a doped semiconductor region along a surface of a tapered trench that has a funnel shape. The funnel-shaped tapered trench can be formed such that the semiconductor layers, such as the doped semiconductor region, do not have any 90° corners within the tapered trench. Thus, the product of $R_{DSON}$*Area can be significantly lower than a comparable structure of a power transistor having a horizontally-oriented channel region. Further, the figure of merit, which is a product of $R_{DSON}$*$Q_G$, is lower than a vertically-oriented transistor structure where the gate electrode is formed within the trench for the same operating conditions. Details regarding the structure and its formation are better understood with respect to particular embodiments as described below, where such embodiments are merely illustrative and do not limit the scope of the present invention.

FIG. 1 includes an illustration of a cross-sectional view of a portion of a workpiece 100. The workpiece 100 includes an underlying doped region 102 that is part of a substrate that may be lightly doped or heavily doped, n-type or p-type. For the purposes of this specification, heavily doped is intended to mean a peak dopant concentration of at least approximately $1 \times 10^{19}$ atoms/cm$^3$, and lightly doped is intended to mean a peak dopant concentration of less than $1 \times 10^{19}$ atoms/cm$^3$. The underlying doped region 102 can be a portion of a heavily doped substrate (e.g., a heavily n-type doped wafer) or may be a buried doped region overlying a base layer of opposite conductivity type or overlying a buried insulating layer (not illustrated) that lies between the base layer and the buried doped region. In a particular embodiment, the underlying doped region 102 can include a lightly doped portion overlying a heavily doped portion (for example, when an overlying semiconductor layer 104 has an opposite conductivity type) to help increase the junction breakdown voltage. In an embodiment, the underlying doped region 102 is heavily doped with an n-type dopant.

In the embodiment illustrated in FIG. 1, the semiconductor layer 104 overlies the underlying doped region 102 and can include a Group 14 element (i.e., carbon, silicon, germanium, or any combination thereof) and any of the dopants as described with respect to the underlying doped region 102 or dopants of the opposite conductivity type. In an embodiment, the semiconductor layer 104 is a lightly doped n-type or p-type epitaxial silicon layer having a thickness in a range of approximately 0.5 microns to approximately 5.0 microns, and a doping concentration no greater than approximately $10^{16}$ atoms/cm$^3$, and in another embodiment, a doping concentration of least approximately $10^{14}$ atoms/cm$^3$. The doping concentration of the semiconductor layer 104 at this point in the process flow may be referred to as the background doping concentration. The semiconductor layer 104 includes a primary surface 105 that is spaced apart from underlying doped region 102. In another embodiment, the semiconductor layer 104 can include a relatively heavier doped region adjacent to the underlying doped region 102 and a relatively lighter doped region over the relatively heavier doped region. The relatively heavier doped region may have a dopant concentration in a range of approximately $1 \times 10^{17}$ atoms/cm$^3$ to approximately $5 \times 10^{17}$ atoms/cm$^3$, and the relatively lighter doped region may have a dopant concentration no greater than approximately $5 \times 10^{16}$ atoms/cm$^3$. Alternatively, the semiconductor layer 104 may have a graded dopant concentration that is relatively heavier near the underlying doped region and relatively lighter closer to the primary surface 105. The semiconductor layer 104 may be epitaxially grown from the underlying doped region 102.

A pad layer 106 and a stopping layer 108 (e.g., a polish-stop layer or an etch-stop layer) are formed over the semiconductor layer 104 using a thermal growth technique, a deposition technique, or a combination thereof. Each of the pad layer 106 and the stopping layer 108 can include an oxide, a nitride, an oxynitride, or any combination thereof. In an embodiment, the pad layer 106 has a different composition as compared to the stopping layer 108. In a particular embodiment, the pad layer 106 includes an oxide, and the stopping layer 108 includes a nitride. The pad layer 106 can have a thickness in a range of approximately 2 nm to approximately 500 nm. In an embodiment, the stopping layer 108 has a thickness in a range of approximately 50 nm to approximately 300 nm. The combined thickness of the pad layer 106 and stopping layer 108 can be in a range of approximately 300 nm to approximately 800 nm.

Figure 2:
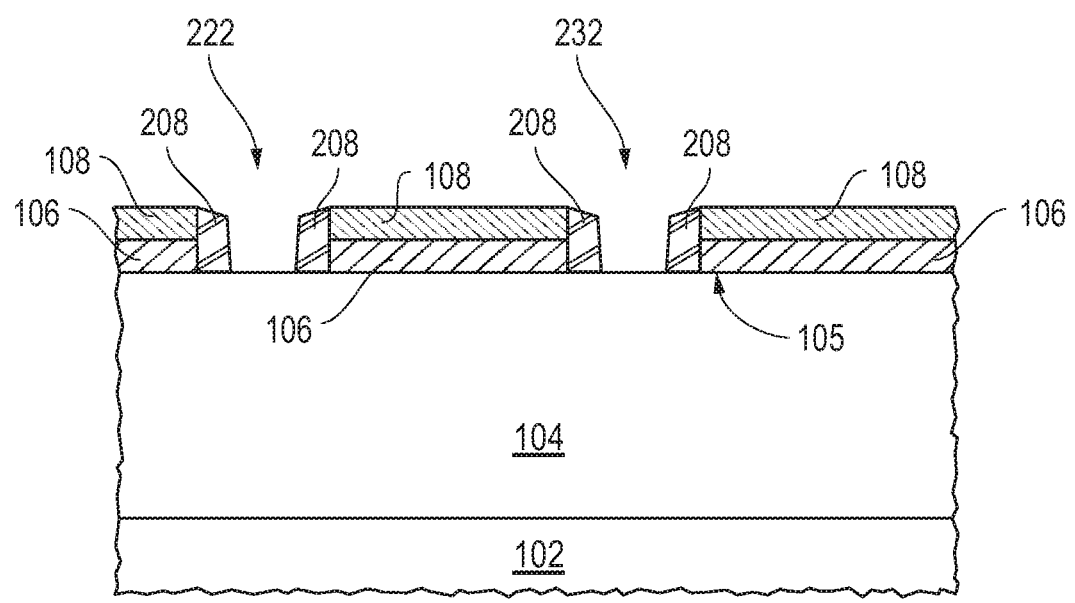
FIG. 2 includes an illustration of a cross-sectional view of the workpiece of FIG. 1 after forming an opening through the pad and stopping layers and sidewall spacers within the opening.

FIG. 2 includes an illustration of a cross-sectional view after patterning the pad and stopping layers 106 and 108 and forming sidewall spacers 208 to define openings 222 and 232. The patterned resist layer (not illustrated) is formed over the stopping layer 108. The pad and stopping layers are etched to define a relatively wider opening, and the patterned photoresist layer is removed. The sidewall spacers 208 are formed within the relatively wider opening to form relatively narrower openings 222 and 232. The sidewall spacers 208 help to form offsets used in creating tapered trenches. The sidewall spacers 208 are formed by depositing a layer and anisotropically etching the layer. The layer for the sidewall spacers 208 can include an oxide, nitride, an oxynitride, or any combination thereof. In an embodiment, the layer has a different composition as compared to the pad layer 106 and may have a composition that is the same or different as compared to the stopping layer 108. In an embodiment, the layer for the sidewall spacers 208 can have a thickness of at least approximately 150 nm, at least approximately 250 nm, or at least approximately 350 nm, and in another embodiment, the layer for the sidewall spacers 208 may have a thickness no greater than approximately 900 nm, no greater than approximately 700 nm, or no greater than approximately 500 nm. In an embodiment, the widths of the openings 222 and 232 at the base of the sidewall spacer 208 can be at least approximately 0.1 micron, at least approximately 0.2 micron, or at least 0.3 micron, and in another embodiment, the widths of the openings 222 and 232 at the base of the sidewall spacer 208 may be no greater than approximately 2.0 micron, no greater than approximately 1.4 micron, or no greater than approximately 0.9 micron.

Figure 3:
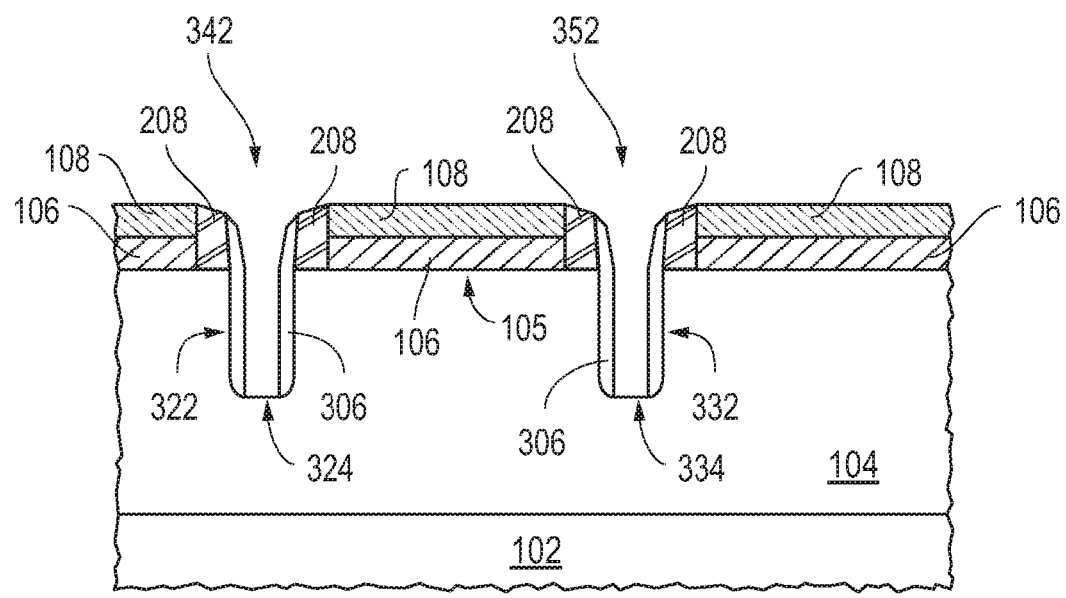
FIG. 3 includes an illustration of a cross-sectional view of the workpiece of FIG. 1 after forming a trench extending through a part of the semiconductor layer and sidewall spacers within the trench.

The semiconductor layer 104 is etched to form trenches 322 and 332 that extend from the primary surface 105 toward the underlying doped region 102, as illustrated in FIG. 3. The trenches 322 and 332 can have a depth that is in a range of approximately 25% to approximately 75% of thickness of the semiconductor layer 104. The sidewall spacers 306 are formed by depositing a layer and anisotropically etching the layer. Bottom 324 and 334 of the trenches 322 and 332 are exposed after forming the sidewall spacers 306. The layer for the sidewall spacers 306 can include an oxide, nitride, an oxynitride, or any combination thereof. In an embodiment, the layer has the same composition as compared to the pad layer 106. In an embodiment, the layer for the sidewall spacers 306 can have a thickness of at least approximately 30 nm, at least approximately 50 nm, or at least approximately 70 nm, and in another embodiment, the layer for the sidewall spacers 306 may have a thickness no greater than approximately 200 nm, no greater than approximately 160 nm, or no greater than approximately 120 nm. In an embodiment, the widths of the openings 342 and 352 within the trenches 322 and 332 can be at least approximately 0.1 micron, at least approximately 0.2 micron, or at least 0.4 micron, and in another embodiment, the width of the openings 342 and 352 within the trenches 322 and 332 may be no greater than approximately 1.3 micron, no greater than approximately 0.9 micron, or no greater than approximately 0.7 micron.

Figure 4:
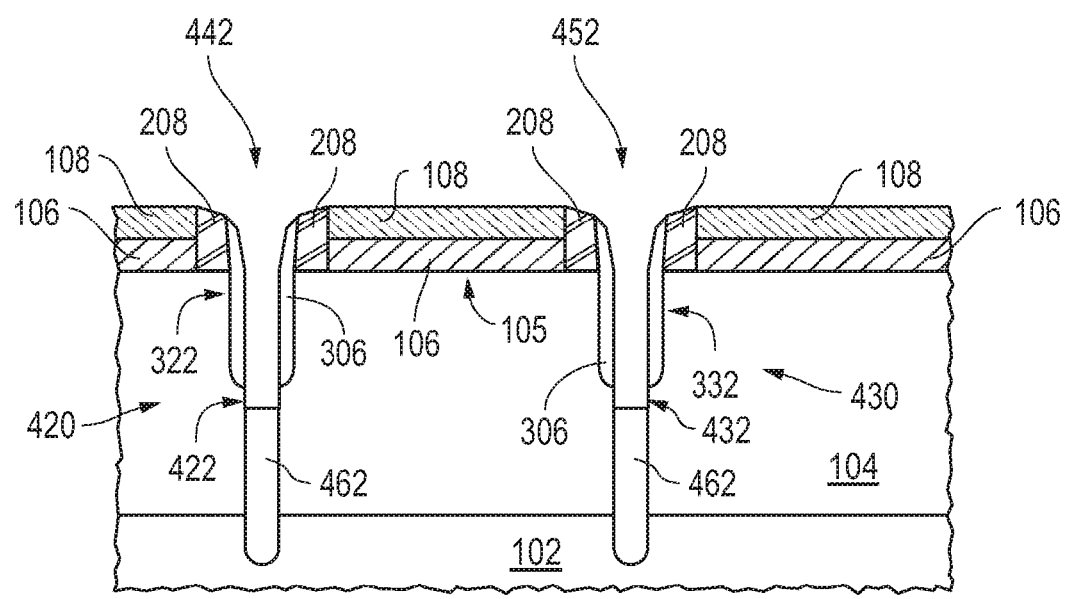
FIG. 4 includes an illustration of a cross-sectional view of the workpiece of FIG. 3 after extending the trench and forming conductive structure within the trench.

The semiconductor layer 104 is anisotropically etched to form trenches 422 and 432 disposed under the trenches 322 and 332, as illustrated in FIG. 4. The trenches 422 and 432 are substantially aligned to the sidewall spacers 306. The trenches 422 and 432 can extend to the underlying doped region 102 (illustrated in FIG. 4) or may be spaced apart from the underlying doped region 102 (not illustrated). Accordingly, the overall trenches 420 and 430 include a relatively wider portion, the trenches 322 and 332, and relatively narrower portions, the trenches 422 and 432. Each of the trenches 422 and 432 is defined by a substantially planar sidewall that substantially lies along a plane that intersects a plane that generally corresponds to the primary surface 105 at an angle of at least 70° or at least 80°. In a particular embodiment, the substantially planar sidewall is substantially vertical.

A conductive layer is formed over the stopping layer 108 and substantially fills the trenches 422 and 432 and the remaining portions of the trenches 322 and 332. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

A portion of the conductive layer that overlies the stopping layer 108 is removed. The removal can be performed using a chemical-mechanical polishing or blanket etching technique. The stopping layer 108 may be used as a polish-stop or etch-stop layer. Etching may be used or continued after the stopping layer 108 is exposed to recess the conductive layer and form conductive structures 462 that are electrically connected to the underlying doped region 102. In the embodiment as illustrated, the conductive structures 462 directly contact the underlying doped region 102. The conductive structures 462 may be recessed to a depth at least approximately 0.5 micron or at least approximately 0.9 micron below the primary surface 105. The maximum normal operating voltage may affect an upper limit for the depth. In a non-limiting example, when the maximum operating voltage is approximately 30 V, the depth may be no greater than approximately 3 microns below the primary surface 105, and when the maximum operating voltage is approximately 100 V, the depth may be no greater than approximately 5 microns below the primary surface 105. In the embodiment as illustrated, uppermost portions of the conductive structures 462 are spaced apart and lie below the trenches 322 and 332. Thus, the conductive structures 462 are formed such that they are disposed within the trenches 422 and 432 but not within the trenches 322 and 332. The recess etch can be performed as an anisotropic etch.

Figure 5:
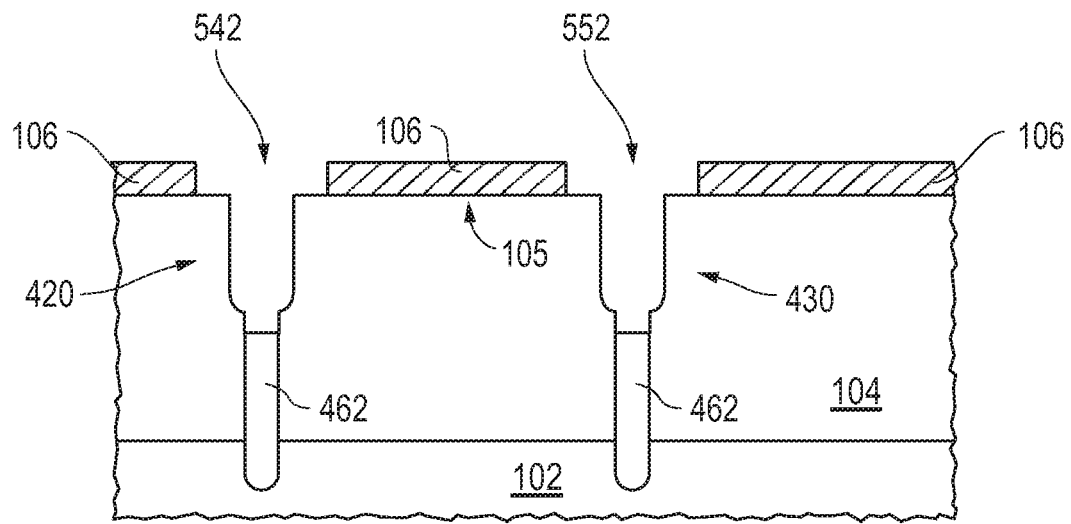
FIG. 5 includes an illustration of a cross-sectional view of the workpiece of FIG. 4 after removing the sidewall spacers and the stopping layer.

As illustrated in FIG. 5, the sidewall spacers 306 and 208 and the stopping layer 108 are removed to form the openings 542 and 552. In a particular embodiment, the sidewall spacers 306 can be removed with a wet oxide etch or a dry isotropic oxide etch when the sidewall spacers 306 include an oxide, and sidewall spacers 208 and the stopping layer 108 can be removed with a wet nitride tech or a dry isotropic nitride etch when the sidewall spacer 208 and the stopping layer 108 include a nitride. Substantially none of the pad layer 106 is removed, and a portion of the primary surface 105 of the semiconductor layer 104 is exposed. The width of the opening in the pad layer 106, the widths of the sidewall spacers 208 and 306, and the extent that the conductive structures 462 is recessed affect the profile of the semiconductor layer 104. The profile of the semiconductor layer 104 will affect the shape of the tapered trench.

Figure 6:
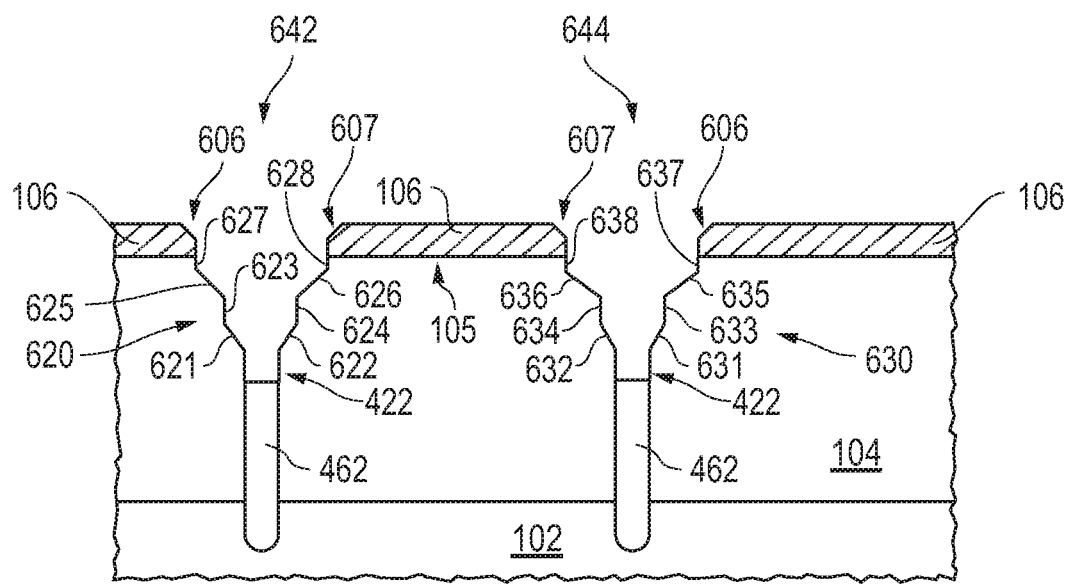
FIG. 6 includes an illustration of a cross-sectional view of the workpiece of FIG. 5 after forming a tapered trench.

In FIG. 6, a tapering etch is performed to affect exposed portions of the workpiece. During the tapering etch, exposed portions of the semiconductor layer 104 are etched to define tapered trenches 620 and 630. In the embodiment as illustrated in FIG. 6, the tapered trenches 620 and 630 includes facets 621, 622, 625, 626, 631, 632, 635, and 636, and surfaces 623, 624, 627, 628, 633, 634, 637, and 638. Each of the facets 621, 622, 625, 626, 631, 632, 635, and 636 are portions of the sidewalls that are substantially planar and lie substantially along planes that intersect a plane corresponding to the primary surface 105 at angles in a range of approximately 20° to approximately 70°, and in a more particular embodiment, at angles in a range of approximately 40° to approximately 60°. In a particular embodiment, the angles corresponding to facets 621 and 625 are within approximately 20° of each other or within approximately 9° of each other, the angles corresponding to facets 622 and 626 are within approximately 20° of each other or within approximately 9° of each other, the angles corresponding to facets 631 and 635 are within approximately 20° of each other or within approximately 9° of each other, and the angles corresponding to facets 632 and 636 are within approximately 20° of each other or within approximately 9° of each other. In a particular embodiment, the facets 621 and 625 are substantially parallel with each other, the facets 622 and 626 are substantially parallel with each other, the facets 631 and 635 are substantially parallel with each other, and the facets 632 and 636 are substantially parallel with each other.

In another particular embodiment, a lowest elevation of each of the facets 621, 622, 625, 626, 631, 632, 635, and 635 is disposed closer to the primary surface 105 than to the bottom of the their corresponding tapered trench 620 or 630, the underlying doped region 102, or both. In a further particular embodiment, substantially all of the facet 625 lies at an elevation higher than any part of the facet 621, substantially all of the facet 626 lies at an elevation higher than any part of the facet 622, substantially all of the facet 635 lies at an elevation higher than any part of the facet 631, substantially all of the facet 636 lies at an elevation higher than any part of the facet 632, or any combination thereof. The surfaces 623, 624, 627, 628, 633, 634, 637, and 638 lie substantially along planes that intersect the plane corresponding to the primary surface 105 at angles greater than approximately 70° or greater than approximately 80° and, in a particular embodiment, are substantially vertical.

The facets 621, 622, 625, 626, 631, 632, 635, and 636 may be formed using a silicon etch with a high sputtering component, separate sputter etch and silicon etches, a high polymerization silicon etch, or another etching technique. In a particular embodiment for a nominal 200 mm diameter wafer, a sputter etch in argon at a pressure in a range of 0.5 to 2 Ton and power in a range of 400 to 800 watts is used to form the angled or faceted edge followed by a fluorine based silicon etch to recess the silicon and faceted edge to the desired depth. After reading this specification, skilled artisans will understand that tapered trenches 620 and 630 in FIG. 6 illustrate an idealized shape and that different shapes and profiles can be accomplished through adjusting the etch, polymerization, and sputtering components of the etch process. Facets 606 and 607 may form within the pad layer 106.

As will be described later in this specification, a resist erosion or a selective isotropic etch process may be used to form a tapered trench in alternative embodiments.

If needed or desired, a field isolation region (not illustrated) may be formed or a thermal oxidation may be performed. The field isolation region can help to isolate the transistor structure being formed from another component within the electronic device. A thermal oxidation can be performed to help round corners of the semiconductor layer 104 that defines the tapered trenches 620 and 630 to reduce the electric field at corners adjacent to each of the primary surface 105 and the facets 621, 622, 625, 626, 631, 632, 635, and 636.

Figure 7:
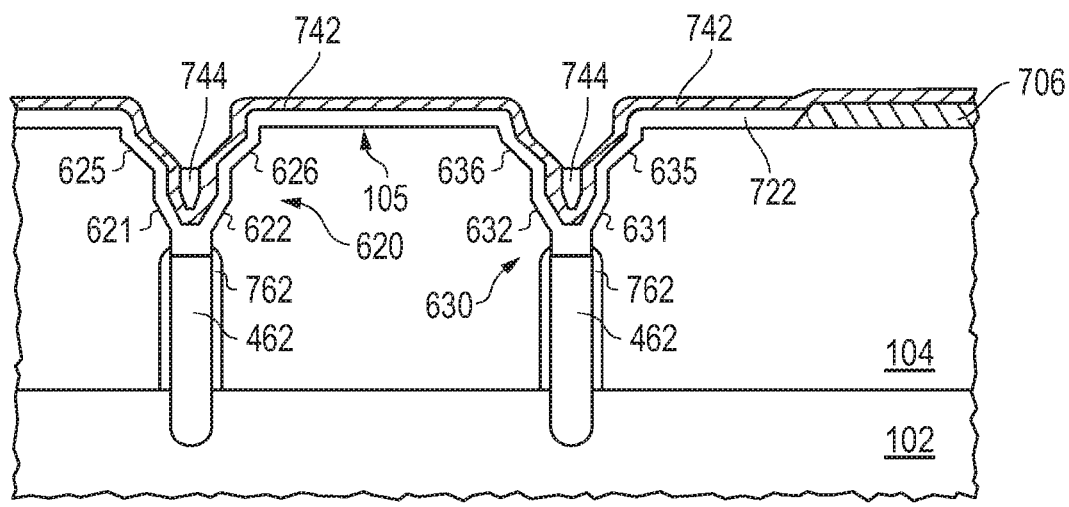
FIG. 7 includes an illustration of a cross-sectional view of the workpiece of FIG. 6 after forming a doped semiconductor region, an insulating layer, and a sacrificial plug.

FIG. 7 includes an illustration of the workpiece at a later time in processing. An insulating layer 706 may be formed at a location spaced apart from the transistor structure being formed. The insulating layer 706 can be used to protect portions of the semiconductor layer 104 during subsequent processing. The insulating layer 706 can include an oxide, a nitride, an oxynitride, or any combination thereof. The insulating layer 706 can have a thickness in a range of approximately 15 nm to approximately 90 nm.

A doped region can be in a form of a doped semiconductor layer 722 that can be formed over a portion of the semiconductor layer 104. The doped semiconductor layer 722 can be part of a drift region for the transistor structure being formed. In an embodiment, the doped semiconductor layer 722 is electrically connected to the conductive structures 462, and in a particular embodiment, the doped semiconductor layer 722 directly contacts the conductive structures 462. In another embodiment, the doped semiconductor layer 722 lies adjacent to the sidewalls of the tapered trenches 620 and 630 and extends to a narrower portions of the tapered trenches (see trenches 422 and 432 in FIG. 4) and is electrically connected to conductive structures 462. The doped semiconductor layer 722 can include any of the materials as described with respect to the semiconductor layer 104. The doped semiconductor layer 722 has a conductivity type that is substantially the same as the conductive structures 462 or the underlying doped region 102. The dopant concentration of the doped semiconductor layer 722 may be between the dopant concentrations of the semiconductor layer 104 at a location adjacent to the primary surface 105 and either or both of the conductive structures 462 and the underlying doped region 102. In an embodiment, the semiconductor layer 722 can have a peak dopant concentration in a range of approximately $5 \times 10^{16}$ atoms/cm$^3$ to approximately $5 \times 10^{18}$ atoms/cm$^3$, in another embodiment, in a range of approximately $2 \times 10^{17}$ atoms/cm$^3$ to approximately $3 \times 10^{18}$ atoms/cm$^3$, and in a further embodiment approximately $4 \times 10^{17}$ atoms/cm$^3$ to approximately $9 \times 10^{17}$ atoms/cm$^3$.

In the embodiment as illustrated in FIG. 7, the doped semiconductor layer 722 is disposed along the facets 621, 622, 625, 626, 631, 632, 635, and 636 and surfaces 623, 624, 627, 628, 633, 634, 637, and 638 and does not completely fill the tapered trenches 620 and 630, and in a particular embodiment does not completely fill the portion of the tapered trenches 620 and 630 defined by the facets 621, 622, 631, and 632. In an embodiment, the doped semiconductor layer 722 can have a thickness of at least approximately 5 nm, at approximately least 11 nm, or at least approximately 20 nm, and in another embodiment, the thickness may be no greater than approximately 400 nm, no greater than approximately 200 nm, or no greater than approximately 90 nm. The doped semiconductor layer 722 can be formed using a selective epitaxial growth technique. In this embodiment, little, if any, of the doped semiconductor layer 722 is formed over the insulating layer 706. In another embodiment, the doped semiconductor layer 722 may be deposited and patterned to remove portions of the doped semiconductor layer 722 that would otherwise overlie the insulating layer 706.

In an alternative embodiment (not illustrated), the doped semiconductor region may be formed from part of the semiconductor layer 104 adjacent to the tapered trenches 620 and 630. A furnace doping and dopant drive cycle may be performed. In another embodiment, the dopant may be implanted using a tilt angle implant to provide doping along the different exposed surfaces within the tapered trenches 620 and 630 that are more uniform than if an implant without any tilt angle is used. Further, more than one tilt angle may be used. The doped semiconductor region can have a dopant concentration and depth in accordance with any of the dopant concentrations and thicknesses as previously described with respect to the doped semiconductor layer 722. For much of the remainder of the specification, the doped semiconductor region will be described with respect to the doped semiconductor layer 722 to simplify understanding of the concepts described herein.

An insulating layer 742 is formed over the doped semiconductor layer 722, and sacrificial plugs 744 are formed over the insulating layer 742 within the tapered trenches 620 and 630. The insulating layer 742 partly fills the tapered trenches 620 and 630, and in a particular embodiment, partly fills the portion of the tapered trenches lying at elevations below the lowest elevation corresponding to the facets 625, 626, 635, and 636. The insulating layer 742 can include an oxide, a nitride, an oxynitride, or any combination thereof. In a particular embodiment, the insulating layer 742 includes an oxide. In an embodiment, the insulating layer 742 can have a thickness of at least approximately 11 nm, at least approximately 15 nm, or at least approximately 20 nm, and in another embodiment, the thickness may be no greater than approximately 90 nm, no greater than approximately 70 nm, or no greater than approximately 50 nm. The insulating layer 742 can be formed using a thermal growth technique, deposition, or any combination thereof. In a particular embodiment, the thickness of the insulating layer 742 can be selected based on a desired drain-to-source breakdown voltage, $BV_{DSS}$ of the transistor structure, and the particular composition of the insulating layer 742. As a non-limiting example, a transistor structure designed with a 30 V $BV_{DSS}$ may have approximately 100 nm of oxide, whereas a transistor structure designed with a 60 V $BV_{DSS}$ may have approximately 200 nm to 250 nm of oxide. In another embodiment (not illustrated), the thickness of insulating layer 742 can be made thicker adjacent to the conductive structures 462 to decrease the capacitance between the underlying doped region 102, and a subsequently deposited conductive layer in the tapered trenches 620 and 630 that will be a conductive electrode.

The sacrificial plugs 744 help to protect a portion of the insulating layer 742 during a subsequent etch. The sacrificial plugs 744 fill a sufficient portion, but not all of the tapered trenches 620 and 630 corresponding to the portion of the insulating layer 742 that is to be protected. In an embodiment, the sacrificial plugs 744 fill a remaining portion of the tapered trench lying at elevations below the lowest elevation corresponding to the facets 625, 626, 635, and 636. In another embodiment, uppermost elevations of the sacrificial plugs 744 are higher than lowermost elevations corresponding to the facets 625. 626, 635, and 636 and are lower than an uppermost elevation corresponding to the facets 625, 626, 635, and 636. The sacrificial plugs 744 have a composition different from the insulating layer 742. When the insulating layer 742 includes an oxide, the sacrificial plugs 744 can include a nitride, an oxynitride, silicon, a metal-containing material, an organic material (for example, photoresist, polyimide, or the like), another suitable material, or any combination thereof. In a particular embodiment, the sacrificial plugs 744 include a nitride. In an embodiment, the layer from which the sacrificial plugs 744 are formed is deposited to a thickness in a range of approximately 11 nm to approximately 150 nm. In an embodiment, the layer is etched to form the sacrificial plugs 744. In a particular embodiment, etching may be performed as a wet etch or a dry isotropic etch.

FIG. 7 further illustrates heavily doped regions 762 that can be formed when the conductive structures 462 includes a doped semiconductor material. Although not previously illustrated, such regions are formed when dopant is diffused during thermal processing used in forming the layers after the conductive structures 462 has been formed. Thus, the heavily doped regions 762 are initially formed earlier in the process but are not illustrated to simplify understanding the concepts described herein. The drain region of the transistor structure being formed includes the doped semiconductor layer 722 along the tapered trenches 620 and 630, the heavily doped regions 762, and underlying doped region 102.

Figure 8:
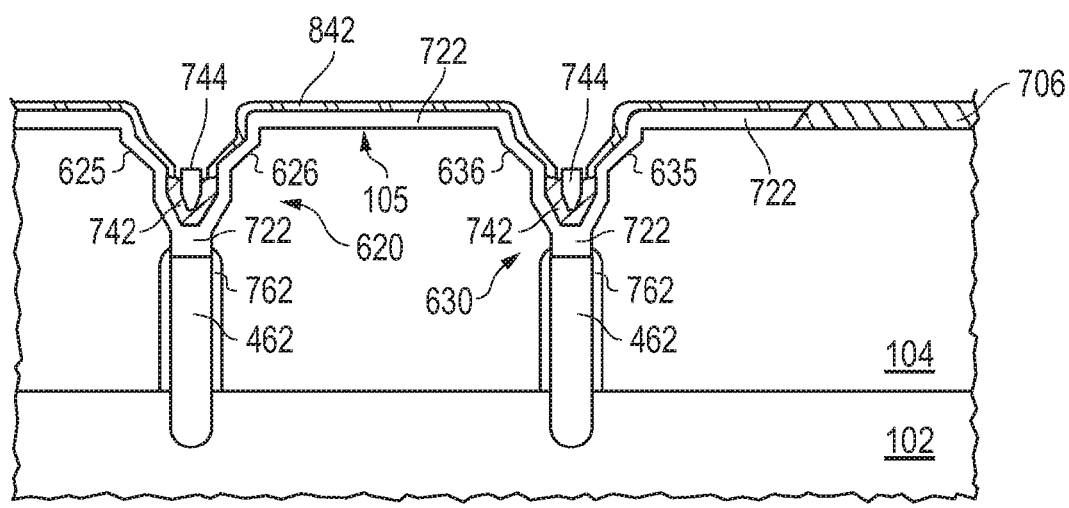
FIG. 8 includes an illustration of a cross-sectional view of the workpiece of FIG. 7 after removing a portion of the insulating layer and forming another insulating layer over the doped semiconductor region.

FIG. 8 illustrates the workpiece after removing portions of the insulating layer 742 not protected by the sacrificial plugs 744 and after forming an insulating layer 842. Portions of the insulating layer 742 can be removed with a wet chemical etchant or a dry isotropic etch that removes exposed portions of the insulating layer 742 without significantly etching the doped semiconductor layer 722 or the sacrificial plugs 744. The insulating layer 842 can be thermally grown or deposited to a thickness that is relatively thinner than the insulating layer 742 as initially formed. In an embodiment, the insulating layer 806 can have a thickness of at least approximately 11 nm or at least approximately 20 nm, and in another embodiment, the insulating layer 806 may have a thickness no greater than approximately 90 nm or no greater than approximately 40 nm. After the insulating layer 842 is formed, the sacrificial plugs 744 are removed.

Figure 9:
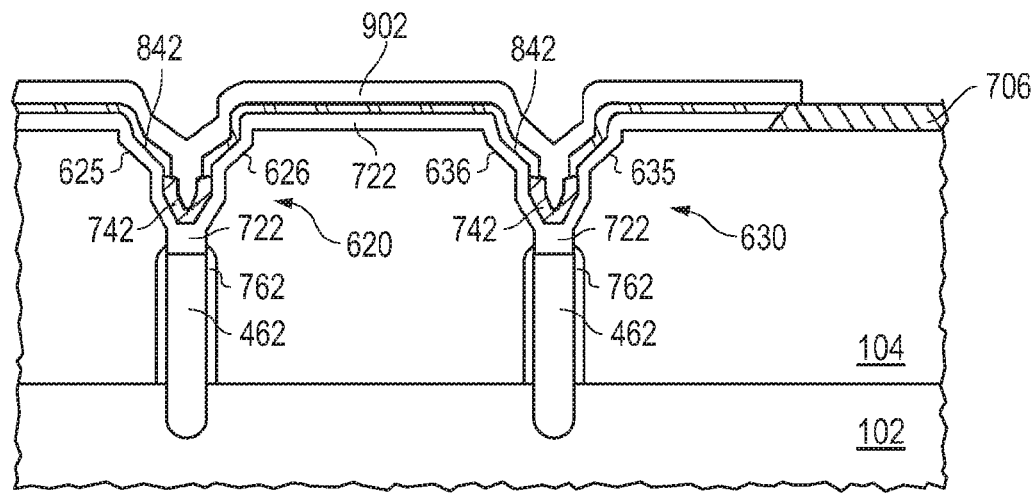
FIG. 9 includes an illustration of a cross-sectional view of the workpiece of FIG. 8 after forming a conductive electrode.

FIG. 9 illustrates the workpiece after forming a conductive electrode 902 that extends into the tapered trenches 620 and 630. The conductive electrode 902 can help to reduce capacitive coupling between the drain region and a subsequently-formed gate electrode. The conductive electrode 902 can include any of the materials as previously described with respect to the conductive structures 462. The conductive electrode 902 can be formed by depositing a conductive layer and patterning the conductive layer. In an embodiment, the conductive layer can have a thickness of at least approximately 50 nm, at least 110 nm, or at least 150 nm, and in another embodiment, the conductive layer may have a thickness no greater than approximately 500 nm, no greater than approximately 300 nm, or no greater than approximately 200 nm. In a particular embodiment, the conductive layer can include a single film or a plurality of films, such as a doped semiconductor film and a refractory metal-semiconductor film. The conductive layer is patterned to form the conductive electrode 902. A lowest elevation of the conductive electrode 902 within the tapered trenches 620 and 630 is at least approximately 0.3 micron, at least approximately 0.7 micron, or at least approximately 1.1 microns below the elevation of the plane that generally corresponds to the primary surface 105. In an embodiment, the insulating layers 742 and 842 electrically insulate the conductive electrode 902 from doped semiconductor layer 722 and the conductive structures 462. In the embodiment as illustrated, the lowest elevation of the conductive electrode 902 is below the lowest elevations of the facets 625, 626, 635, and 636, and below the highest elevations of the facets 621, 622, 631, and 632 and above the lowest elevations of the facets 621, 622, 631, and 632. The insulating layer 742 is significantly thicker than the insulating layer 842 and helps to reduce capacitive coupling between the conductive electrode 902 and the conductive structures 462, if the insulating layer 742 were to be replaced by the insulating layer 842.

Figure 10:
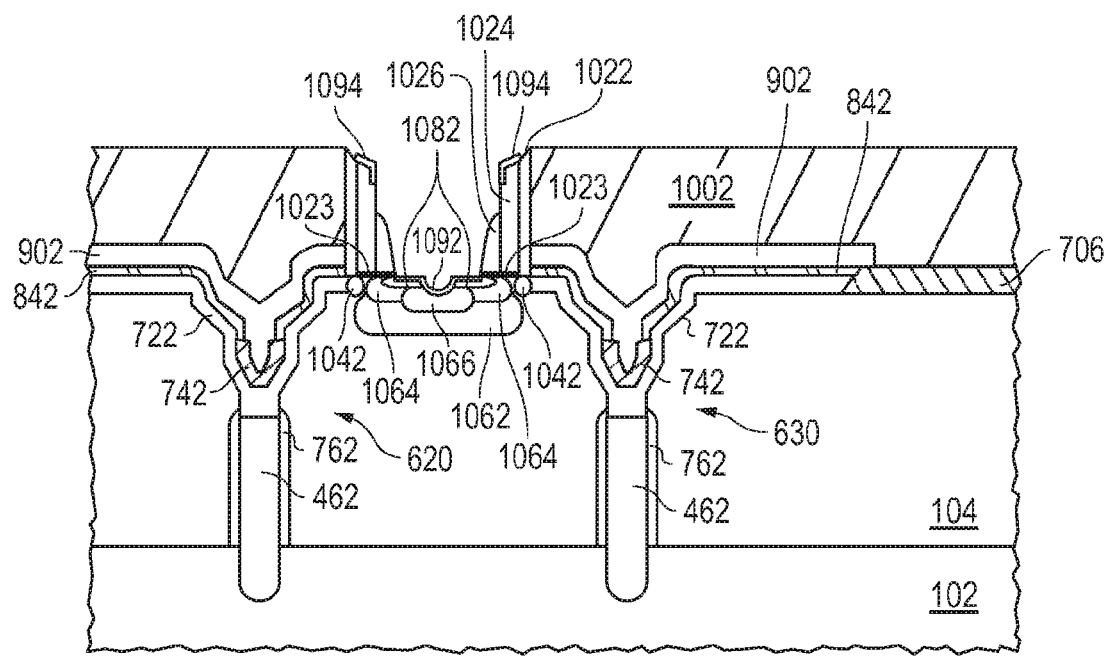
FIG. 10 includes an illustration of a cross-sectional view of the workpiece of FIG. 9 after forming remaining portions of a transistor structure.

Processing is continued to complete formation of the transistor structure as illustrated in FIG. 10. Details regarding such processing are described in US 2011/0193143, which is incorporated by reference herein in its entirety. A patterned insulating layer 1002 is formed over the tapered trenches 620 and 630 and defines an opening where other parts of the transistor structure are formed. The patterned insulating layer 1002 can include an oxide, a nitride, an oxynitride, or any combination thereof. The patterned insulating layer 1002 can include a single film or a plurality of films. The patterned insulating layer 1002 can have a thickness in a range of approximately 0.3 micron to approximately 2.0 microns. Insulating spacers 1022 are adjacent to the patterned insulating layer 1002 and cover doped regions 1042. A gate dielectric layer 1023 is formed over exposed portions of the doped semiconductor layer 722, and gate members 1024 are formed over the gate dielectric layer 1023 and adjacent to the insulating spacers 1022. The gate members 1024 include gate electrodes for the transistor structures being formed. In an embodiment, substantially all of the gate members 1024 are disposed at elevations above the primary surface 105. Insulating spacers 1026 are formed over the doped semiconductor layer 722 and adjacent to the gate members 1024.

Turning to the features formed within the semiconductor layers 104 and 722, doped regions 1042 are disposed below the insulating spacer 1022. The doped regions 1042 can have peak dopant concentrations in a range of approximately $2 \times 10^{16}$ atoms/cm$^3$ to approximately $2 \times 10^{18}$ atoms/cm$^3$. The depths of the doped regions 1042 can be in a range of approximately 0.02 micron to approximately 0.30 micron. The widths of the doped regions 1042 can be similar to the widths to the insulating spacers 1022 at their bases. A body doped region 1062 can have a peak dopant concentration in a range of approximately $1 \times 10^{17}$ atoms/cm$^3$ to approximately $1 \times 10^{18}$ atoms/cm$^3$. The peak dopant concentration of the body region 1062 may be at a depth in a range of approximately 0.2 micron to approximately 0.9 micron from the uppermost surface of the doped semiconductor layer 722. Channel doped regions 1064 can have peak dopant concentrations in a range of approximately $5 \times 10^{16}$ atoms/cm$^3$ to approximately $2 \times 10^{18}$ atoms/cm$^3$. In an embodiment, the channel doped regions 1064 can have peak dopant concentrations at depths in a range of approximately 0.05 to approximately 0.4 micron. Source regions 1082 may include relatively lighter doped portions and relatively heavier doped portions. The relatively lighter portions of the source regions 1082 can have peak dopant concentrations in a range of approximately $1 \times 10^{17}$ atoms/cm$^3$ to approximately $5 \times 10^{18}$ atoms/cm$^3$, and the relatively heavier portions of the source regions 1082 can have can have peak dopant concentrations of at least approximately $1 \times 10^{19}$ atoms/cm$^3$. The source regions 1082 can have depths in a range of approximately 0.05 nm to approximately 0.4 nm. A body contact region 1066 has a peak doping concentration at least approximately $1 \times 10^{19}$ atoms/cm$^3$. The doped regions 1042 and the source regions 1082 have the same conductivity type as the doped semiconductor layer 722 (for example, n-type doping), and the body region 1062, the channel doped regions 1064, and the body contact region 1066 have the opposite conductivity type (for example, p-type doping).

The drain regions include the doped regions 1042, the doped semiconductor layer 722, heavily doped regions 762, and the conductive structures 462. Portions of the source regions 1082 and drain regions are disposed adjacent of the primary surface 105, and other portions of the drain regions are disposed within the tapered trenches 620 and 630. The channel regions lie along the primary surface 105, and the gate members 1024 include gate electrodes that overlie the channel regions.

In an alternative embodiment, a deep body region (not illustrated) has the same conductivity type as and extends below the body region 1062. The deep body region can have a peak dopant concentration in a range of approximately $8 \times 10^{15}$ atoms/cm$^3$ to approximately $2 \times 10^{17}$ atoms/cm$^3$. The deep body region may extend to a depth from the primary surface 105 in a range of approximately 0.6 micron to approximately 1.1 microns below the uppermost surface of the doped semiconductor layer 722.

In FIG. 10, a refractory silicide member 1092 is formed from exposed portions of the source regions 1082 and body contact region 1066, and refractory silicide members 1094 are formed from exposed portions of the gate members 1024. The refractory silicide member 1092 electrically shorts the source regions 1082 to the body contact region 1066.

Figure 11:
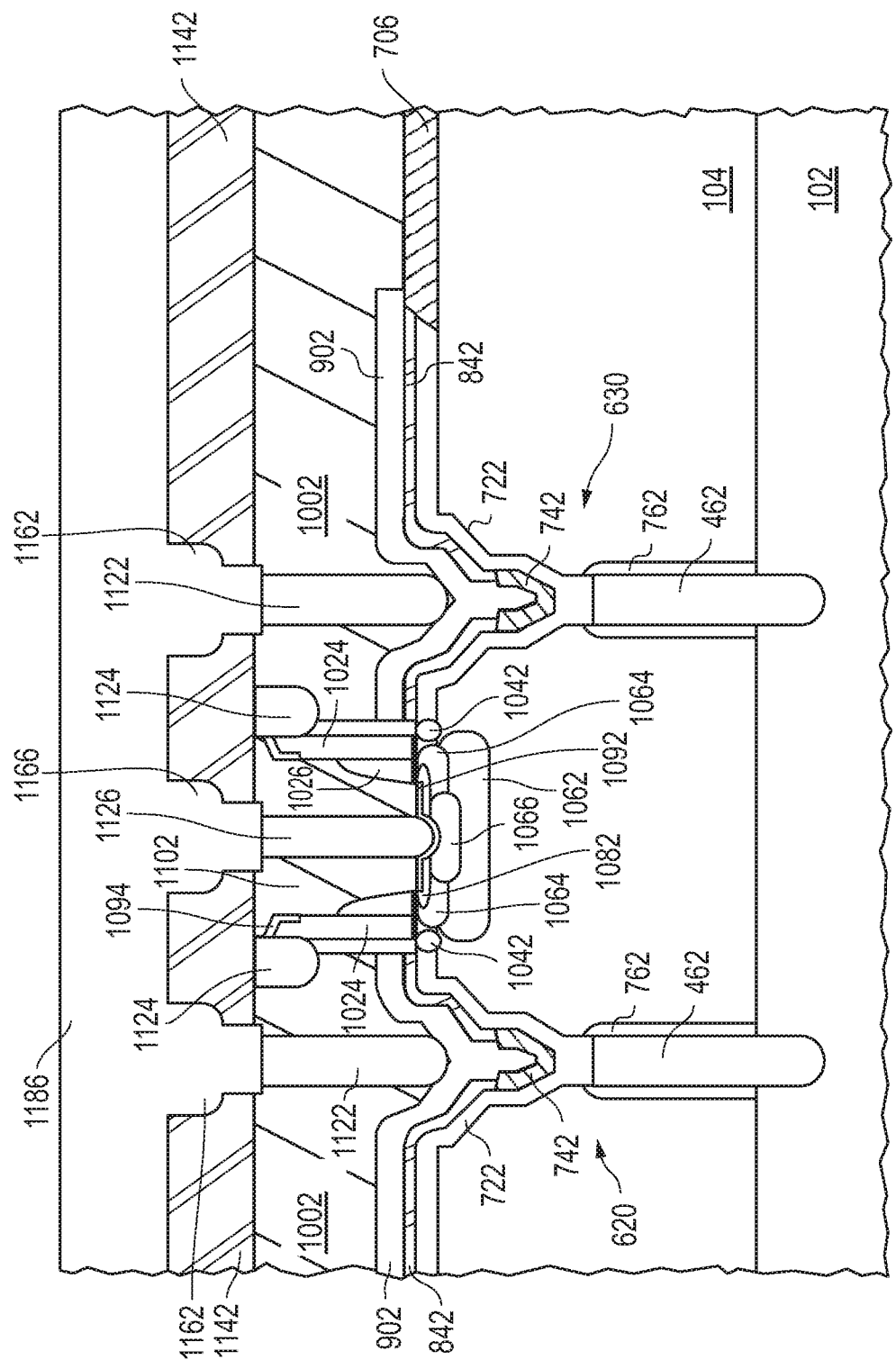
FIG. 11 includes an illustration of a cross-sectional view of the workpiece of FIG. 10 after forming a substantially completed electronic device.

FIG. 11 includes an illustration of a substantially completed electronic device. An insulating layer 1102 is formed within an opening within the patterned insulating layer 1002 to fill in the opening defined by the gate members 1024 and the insulating spacers 1026. After planarization, contact openings are formed within the insulating layers 1002 and 1102, and conductive plugs 1122, 1124, and 1126 are formed within the contact openings. The conductive plugs 1122 contact the conductive electrode 902, the conductive plugs 1124 contact the refractory metal silicide members 1094 that contacts the gate members 1024, and the conductive plug 1126 contacts the refractory metal silicide member 1092 that contacts the source regions 1082 and the body contact region 1066. The conductive plugs 1122, 1124, and 1126 may be formed during the same or different processing sequences. Many other conductive plugs are formed, and such other conductive plugs would be visible in other views.

An interlevel dielectric (ILD) layer 1142 is formed over the insulating layers 1002 and 1102 and the conductive plugs 1122, 1124, and 1126 and can include a single film or a plurality of discrete films. The ILD layer 1142 may be planarized and patterned to define via openings, and conductive plugs 1162 and 1166 are formed within the via openings. The conductive plugs 1162 are electrically connected to the conductive electrode 902, and the conductive plug 1166 is electrically connected to the source regions 1082 and the body contact region 1066. The conductive plugs 1162 and 1166 may be formed during the same or different processing sequences. Many other conductive plugs are formed, and such other conductive plugs would be visible in other views. Another ILD layer (not illustrated) is formed over the conductive plugs 1162 and 1166 and can include a single film or a plurality of discrete films. Such other ILD layer may be planarized and patterned to define an interconnect trench, and interconnect member 1186 is formed within the interconnect trench. The interconnect member 1186 is electrically connected to the conductive electrode 902, the source regions 1082, and the body contact region 1066. Many other interconnect trenches and conductive interconnect members are formed, and such other interconnect members would be visible in other views. For example, additional via plugs and another interconnect member can be electrically connected to the gate members 1024 but are not illustrated in FIG. 11.

Although not illustrated, additional or fewer layers or features may be used as needed or desired to form the electronic device. Field isolation regions are not illustrated but may be used to help electrically isolate portions of a high-side power transistor from a low-side power transistor. In another embodiment, more insulating and interconnect levels may be used. A passivation layer can be formed over the workpiece or within the interconnect levels. After reading this specification, skilled artisans will be able to determine layers and features for their particular application. Throughout the process, anneals and other heat cycles are not described but will be used to active a dopant, drive a dopant, densify a layer, achieve another desired result, or any combination thereof. After reading this specification, skilled artisans will be able to determine a particular process flow for a particular application or to achieve a desired electronic device consistent with the teachings herein.

The electronic device can include many other transistor structures that are substantially identical to the transistor structures as illustrated in FIG. 11. The transistor structures can be connected in parallel to each other to form a power transistor. Such a configuration can give a sufficient effective channel width of the electronic device that can support the relatively high current flow that is used during normal operation of the electronic device. In a particular embodiment, each power transistor may be designed to have a maximum source-to-drain voltage difference of approximately 30 V, and a maximum source-to-gate voltage difference of approximately 20 V. During normal operation, the source-to-drain voltage difference is no greater than approximately 20 V, and the source-to-gate voltage difference is no greater than approximately 9 V.

Figure 12:
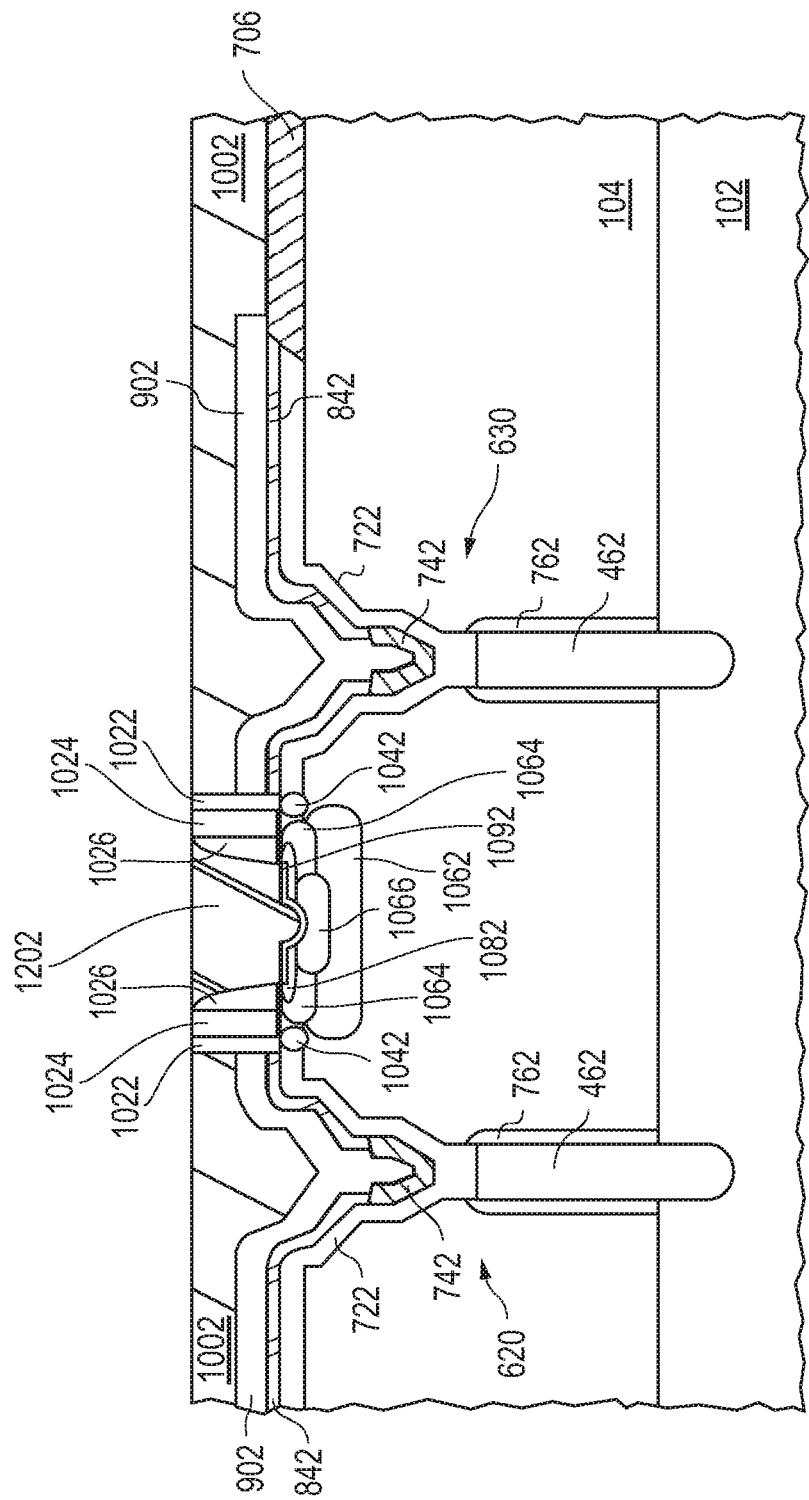
FIG. 12 includes an illustration of a cross-sectional view of the workpiece of FIG. 10 after forming an insulating layer over the source and body regions and reducing the heights of features overlying the primary surface.
Figure 13:
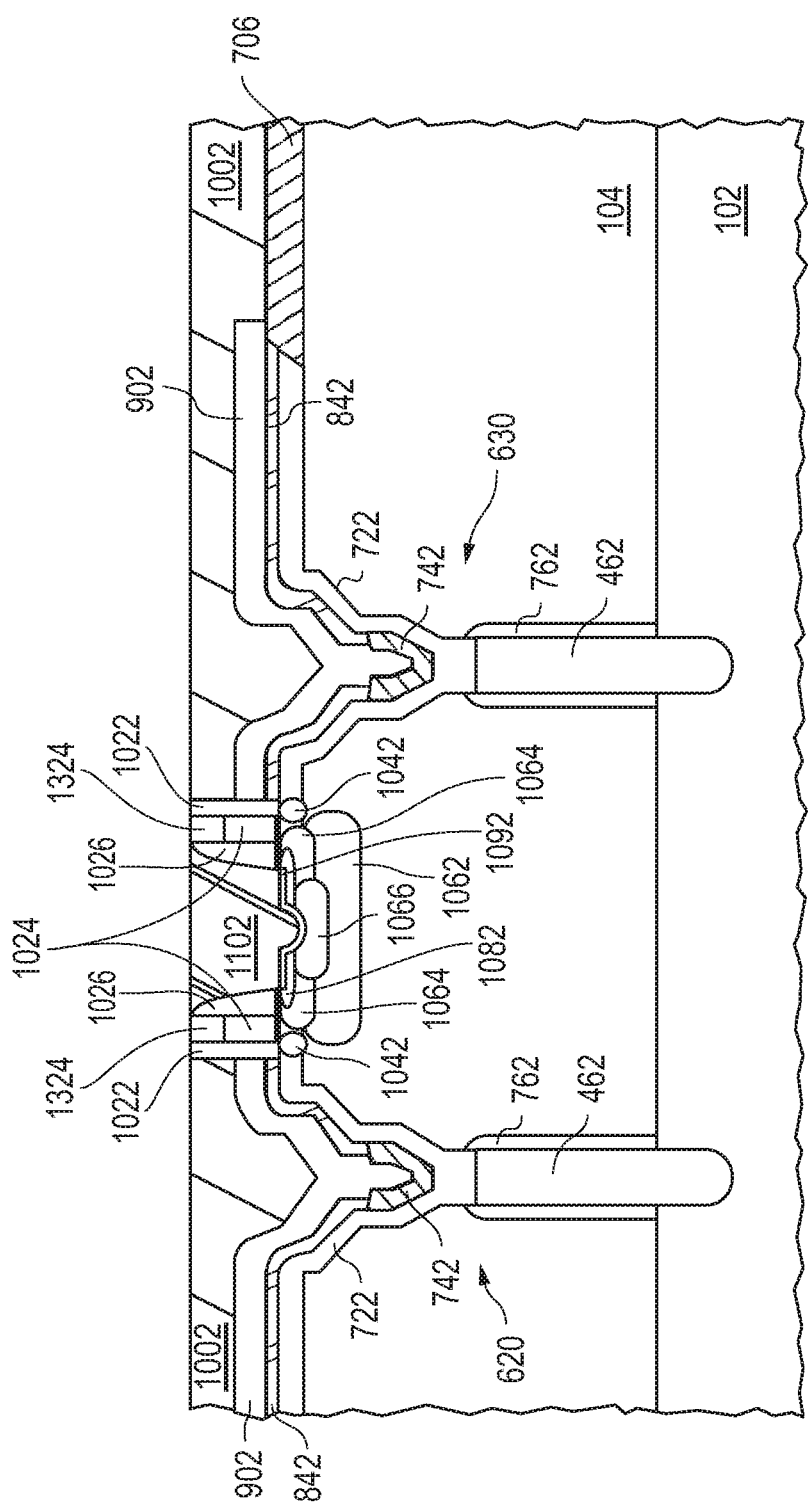
FIG. 13 includes an illustration of a cross-sectional view of the workpiece of FIG. 12 after removing a portion of the gate member and forming a conductive plug over the remaining portion of the gate member.

In an alternative embodiment, the heights of the gate members 1024 may be reduced, and such a reduction may help to reduce $Q_G$. After forming the structure as illustrated in FIG. 10, the insulating layer 1102 can be formed as previously described. A non-selective etch or polish may be used to reduce the thickness and heights of features as illustrated in FIG. 12. The etch or polish may be targeted so that in an embodiment, the patterned insulating layer 1002 is at least approximately 110 nm or at least 150 nm thick over the conductive electrode 902, and in another embodiment, the patterned insulating layer 1002 is no more than 700 nm or no more than approximately 400 nm thick over the conductive electrode 902. Optionally, processing can continue to remove portions of the gate members 1024 and form conductive plugs 1324, such as refractory metal plugs or refractory metal silicide plugs, corresponding to regions where the portions of the gate members 1024 was removed, as illustrated in FIG. 13. An ILD layer (not illustrated) can be formed over the insulating layers 1002 and 1102 and the conductive plugs 1324. The ILD layer can be patterned, and conductive plugs 1122, 1124, and 1126 can be formed as previously described. The remaining portion of processing as previously described can be used to form a substantially completed electronic device.

Figure 14:
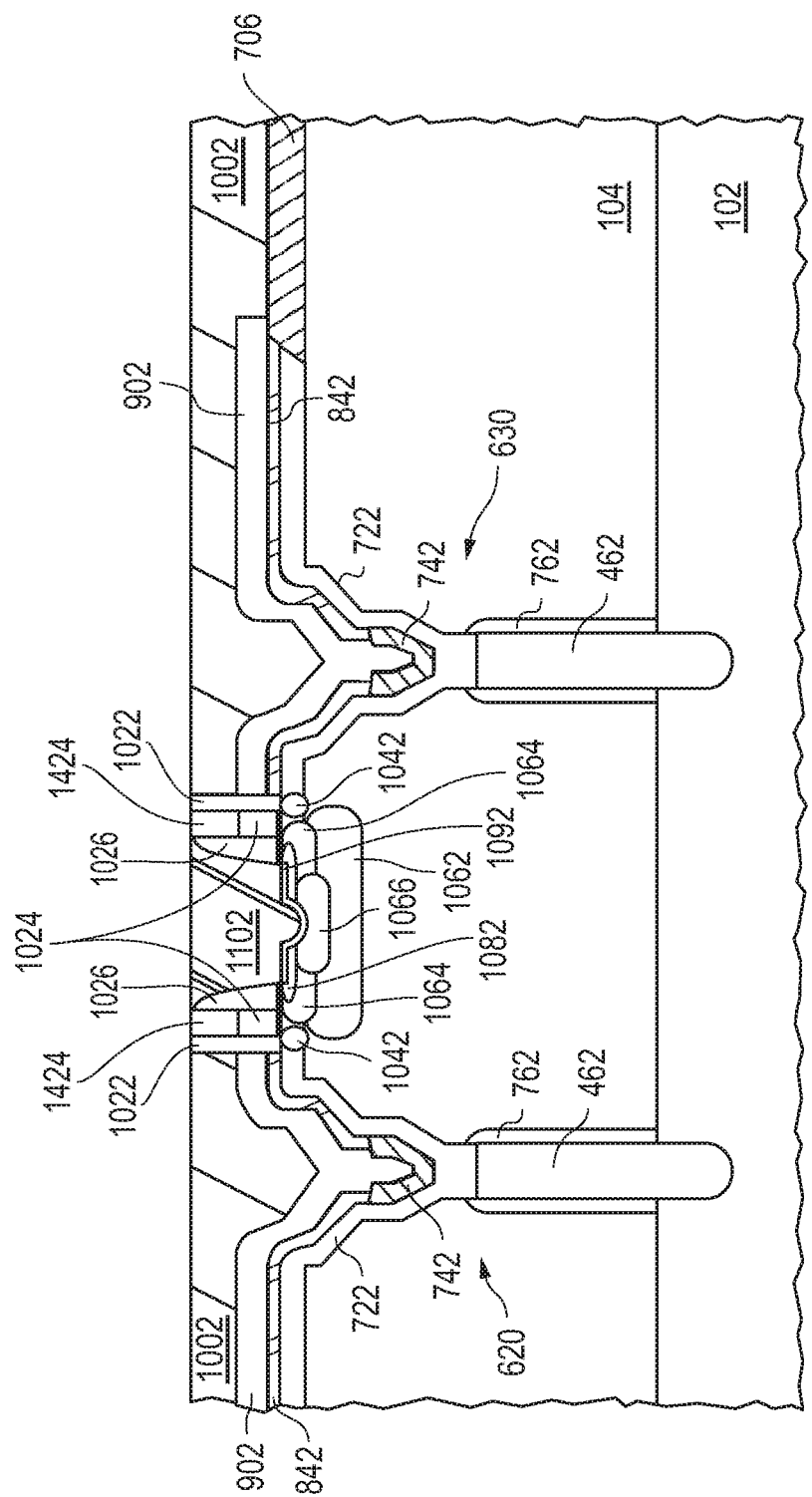
FIG. 14 includes an illustration of a cross-sectional view of the workpiece of FIG. 10 after performing a process similar to the embodiment of FIGS. 12 and 13 except that the heights of features are reduced to a lesser degree.

In another alternative embodiment, the heights of the gate members 1024 may not be reduced nearly as much. After forming the structure as illustrated in FIG. 10, the insulating layer 1102 can be formed as previously described. A non-selective etch or polish may be used to reduce the thickness and heights of features as illustrated in FIG. 14. However, unlike the etch or polish as described with respect to FIG. 12, the etch or polish may not remove more than approximately 200 nm or no more than approximately 90 nm of the thickness of the patterned insulating layer 1002. The etch or polish is used to provide better access to the gate members 1024 during a selective removal operation. Processing can continue to remove portions of the gate members 1024 and form conductive plugs 1424 similar to the embodiment that included the conductive plugs 1324. An ILD layer (not illustrated) can be formed over the insulating layers 1002 and 1102 and the conductive plugs 1424. The ILD layer can be patterned, and conductive plugs 1122, 1124, and 1126 can be formed as previously described. The remaining portion of processing as previously described can be used to form a substantially completed electronic device.

Figure 15:
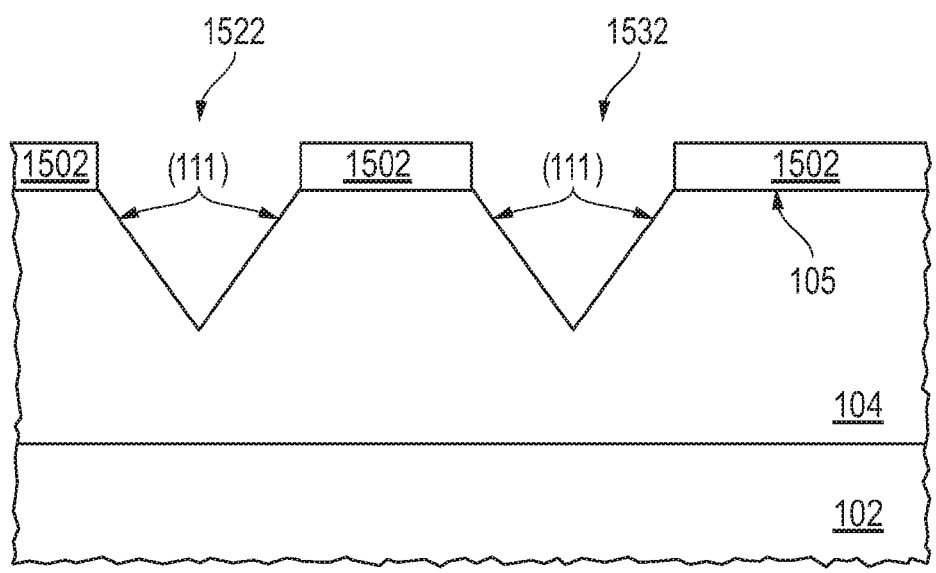
FIG. 15 includes an illustration of a cross-sectional view of a portion of a workpiece after forming a patterned masking layer and selectively etching a semiconductor layer along a particular set of crystal planes.

In a further alternative embodiment, tapered trenches may be formed by taking advantage of crystallographic planes within the semiconductor layer 104. In a particular embodiment, the semiconductor layer 104 is substantially monocrystalline silicon, and the primary surface 105 lies substantially along a (100) crystal plane. In the embodiment as illustrated in FIG. 15, a masking layer 1502 is formed over the semiconductor layer 104 and defines openings when the semiconductor layer 104 is to be etched. A solution of a base and an alcohol can selectively etch the semiconductor layer 104 to provide exposed surfaces substantially along (111) crystal planes to form the openings 1522 and 1532. The base can include KOH, NaOH, $(CH_3)_4NOH$, another suitable base or any combination thereof. The alcohol can include methanol, ethanol, propanol, another suitable alcohol, or any combination thereof. The masking layer 1502 is then removed.

Figure 16:
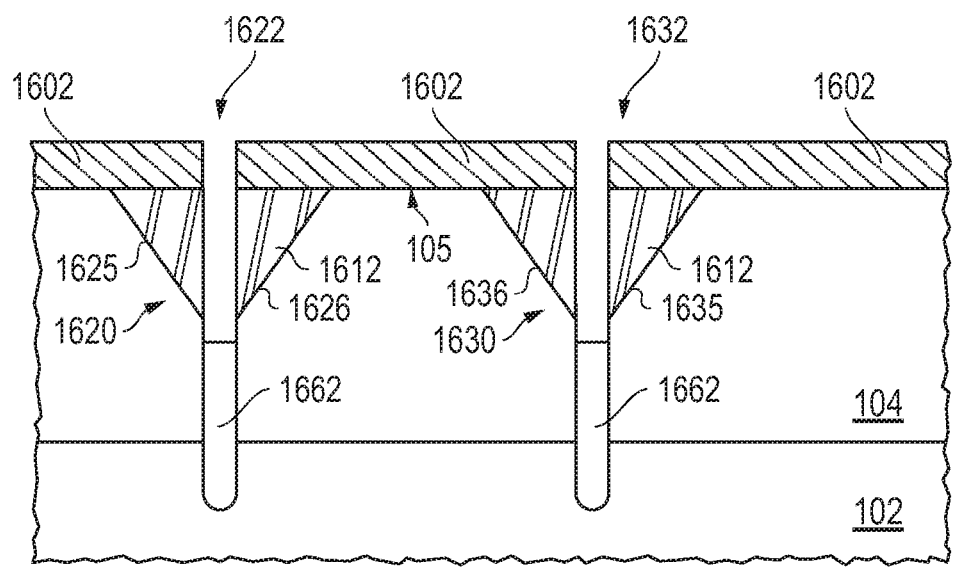
FIG. 16 includes an illustration of a cross-sectional view of the workpiece of FIG. 15 after forming a sacrificial layer, a patterned masking layer, forming a tapered trench, and forming a conductive structure within a lower portion of the tapered trench.

A sacrificial layer 1612 and a patterned masking layer 1602 are formed over the semiconductor layer 104, as illustrated in FIG. 16. In an embodiment, the sacrificial layer 1612 can include an oxide, a nitride, an oxynitride, a metal-containing material, or any combination thereof. After the sacrificial layer 1612 is deposited, portions of the sacrificial layer 1612 overlying the primary surface 105 are removed using a polishing or etching technique. The masking layer 1602 is formed over the sacrificial layer 1612. The masking layer 1602 may be similar to a combination of the pad layer 106 and stopping layer 108 as previously described. In another embodiment, the masking layer 1602 can include an organic resist material. The masking layer 1602 is patterned to define openings 1622 and 1632. The sacrificial layer 1612 and a portion of the semiconductor layer 104 are etched to extend the openings 1622 and 1632 to or near the underlying doped region 102. The depths of the openings 1622 and 1632 can be any depth as described with respect to the openings 442 and 452. The tapered trenches 1620 and 1630, defined by the semiconductor 104, are formed and include facets 1625, 1626, 1635, and 1636. A conductive layer is formed within the openings 1622 and 1632 and is etched and recessed to form conductive structures 1662 that are substantially similar to the conductive structures 462. Accordingly, the conductive structures 1662 can be formed with any of the materials, films, and techniques as previously described with respect to the conductive structures 462.

Figure 17:
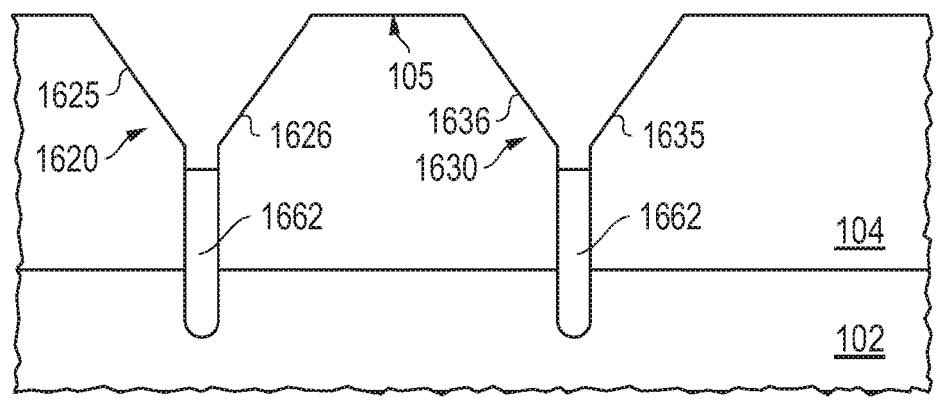
FIG. 17 includes an illustration of a cross-sectional view of the workpiece of FIG. 17 after removing the sacrificial layer and the patterned masking layer.

The masking layer 1602 and the sacrificial layer 1612 are then removed, as illustrated in FIG. 17. The facets 1625, 1626, 1635, and 1636 substantially correspond to (111) crystal planes, and accordingly, intersect a plane that corresponds to the primary surface at an angle of approximately 55°.

Processing can be continued as described with respect to FIG. 7 until the formation of a substantially completed electronic device. In this embodiment, a single set of facets are formed rather than more than one set. Further, by using the selective etch, the angle of the facets may be well controlled, as they will substantially correspond to (111) crystal planes.

Figure 18:
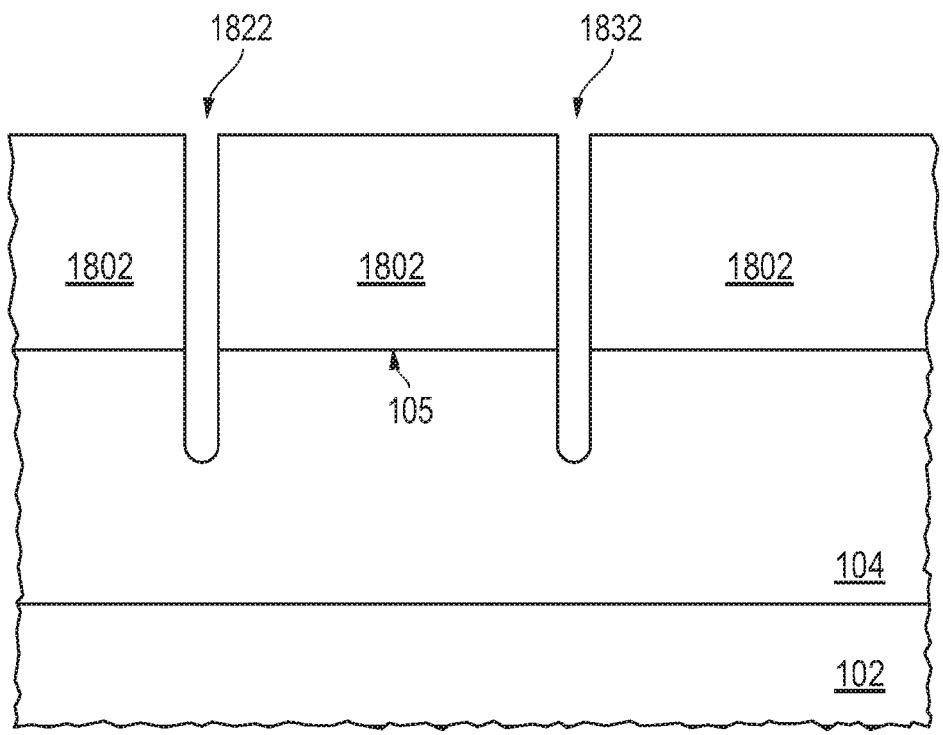
FIG. 18 includes an illustration of a cross-sectional view of a portion of a workpiece after forming a patterned resist layer and selectively etching the semiconductor layer to form a part of a trench.
Figure 19:
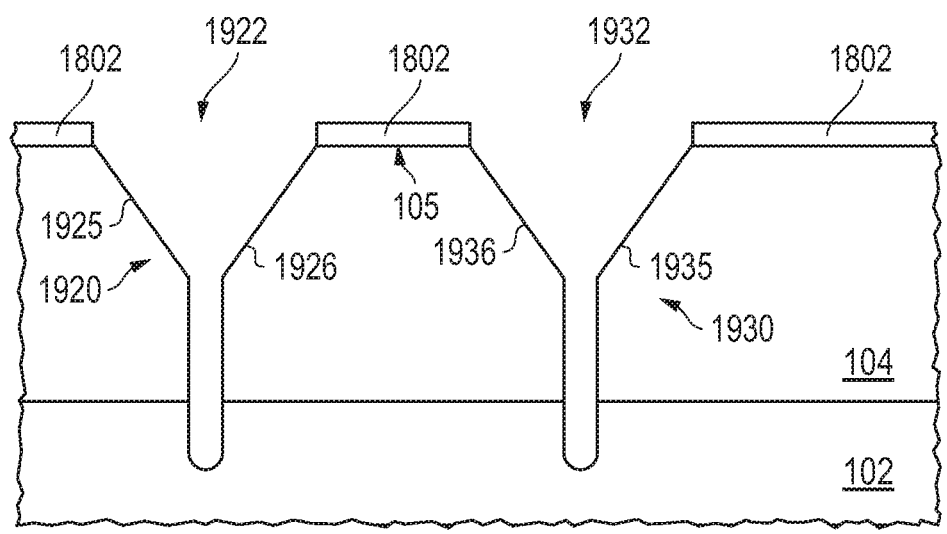
FIG. 19 includes an illustration of a cross-sectional view of the workpiece of FIG. 18 after forming a tapered trench using a resist erosion process.

In another embodiment, a resist erosion process may be used to form a tapered trench. In FIG. 18, a relatively thick resist layer 1802 is formed over the semiconductor layer 104 and is patterned to define openings 1822 and 1832. The semiconductor layer 104 is anisotropically etched to extend the openings 1822 and 1832 into the semiconductor layer 104 to a depth as described with respect to the openings 342 and 352 in FIG. 3. During a resist erosion portion of the etch, both the resist layer 1802 and the semiconductor layer 104 are etched. In a particular embodiment, the resist layer 1802 is isotropically etched, and the semiconductor layer 104 is anisotropically etched. As the resist layer 1802 is eroded, more of the semiconductor layer 104 is exposed, and as more of the semiconductor layer 104 is exposed, openings 1922 and 1932 are formed and include widened portions, as illustrated in FIG. 19. A resulting tapered trenches 1920 and 1930 includes facets 1925, 1926, 1935, and 1936 and lie substantially along planes that intersect the plane corresponding to the primary surface at an angle as previously described with respect to the facets 625, 626, 635, and 636. The remaining portion of the resist layer 1802 is removed. A conductive layer can be deposited over the workpiece to a thickness sufficient to substantially completely fill a narrower portion of the tapered trenches 1920 and 1930. The conductive layer can be anisotropically etched to remove portions of the conductive lying outside the narrower portion of the tapered trenches 1920 and 1930 to form conductive structures (not illustrated). If the conductive layer can be etched selectively to the semiconductor layer 104, the conductive structure can be recessed within the narrower portion of the tapered trenches 1920 and 1930, and such conductive structures can have shapes substantially similar to the conductive structures 1662. The remaining portion of processing as previously described starting at FIG. 7 can be used to form a substantially completed electronic device.

The electronic device includes transistor structures having doped semiconductor regions along a surface of tapered trenches that have funnel shapes. The funnel-shaped tapered trenches can be formed such that the semiconductor layers, such as the doped semiconductor region (for example, the doped semiconductor layer 722), do not have any 90° corners. Thus, the product of $R_{DSON}$*Area can be significantly lower than a comparable structure having Texas Instruments's NexFETT™-brand cell architecture. Further, the figure of merit, which is a product of $R_{DSON}$*$Q_G$, is lower than a vertically-oriented transistor structure where the gate electrode is formed within the trench for the same operating conditions. While the funnel-shaped tapered trenches previously described have facets, facets are not required for all funnel-shaped tapered trenches.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a semiconductor layer overlying a substrate and having a primary surface that generally corresponds to a first plane, and a trench extending into the semiconductor layer and having a tapered shape including a relatively wider portion adjacent to the primary surface and a relatively narrower portion farther from the primary surface as compared to the relatively wider portion, wherein, from a cross-sectional view, the relatively narrower portion is defined by a substantially planar sidewall that lies along a second plane that intersects the first plane at an angle of greater than approximately 70°. The electronic device can further include a doped semiconductor region that lies adjacent to a sidewall of the trench having the tapered shape, wherein the doped semiconductor region extends to the narrower portion and has a dopant concentration greater than a dopant concentration of the semiconductor layer at a location adjacent to the primary surface.

In an embodiment of the first aspect, the electronic device further includes a conductive structure disposed within the trench below the doped semiconductor region. In a particular embodiment, the doped semiconductor region is electrically connected to the conductive structure. In a more particular embodiment, the electronic device further includes an underlying doped region, wherein the semiconductor layer is disposed over the underlying doped region, and the conductive structure is electrically connected to the underlying doped region. In another embodiment, the electronic device includes a transistor structure, and the doped semiconductor region is part of a drain region of the transistor structure. In still another embodiment, the doped semiconductor region has a dopant concentration in a range of approximately $5\times10^{16}$ atoms/cm$^3$ to approximately $5\times10^{18}$ atoms/cm$^3$. In yet another embodiment, the tapered shape includes a funnel shape.

In a second aspect, an electronic device can include a semiconductor layer overlying a substrate and having a primary surface that generally corresponds to a first plane, and a trench having a first portion, a second portion, and a third portion, wherein the first, second, and third portions are disposed within the semiconductor layer, the first and third portions are tapered, and from a cross-sectional view, the second portion is defined by a sidewall that lies along a second plane that intersects the first plane at an angle of greater than approximately 70°.

In an embodiment of the second aspect, the electronic device further includes a doped semiconductor region disposed along the first, second, and third portions of the trench, wherein a dopant concentration of the doped semiconductor region is greater than a dopant concentration of the semiconductor layer at a location adjacent to the primary surface. In a particular embodiment, the electronic device further includes a conductive structure, wherein the trench has a fourth portion disposed within the semiconductor layer at an elevation below the first, second, and third portions of the trench, and the conductive structure is disposed within the fourth portion of the trench. In a more particular embodiment, the fourth portion of the trench has a substantially vertical sidewall. In another particular embodiment, the electronic device further includes a first insulating layer disposed along the first portion of the trench, and a second insulating layer disposed along a second portion of the trench, wherein the second insulating layer is thicker than the first insulating layer. The electronic device still further includes a conductive electrode, wherein the first insulating layer is disposed between the first portion of the trench and the conductive electrode, and the second insulating layer is disposed between the second portion of the trench and the conductive electrode.

In a third aspect, an electronic device can include a semiconductor layer overlying a substrate and having a primary surface, wherein the primary surface generally lies substantially along a plane, a trench having a tapered shape, a conductive structure within a relatively narrower portion of the trench, and a conductive electrode within a relatively wider portion of the trench, wherein the conductive electrode and the conductive structure are electrically insulated from each other.

In an embodiment of the third aspect, the conductive electrode extends into the trench such that a lowest elevation of the conductive electrode is at least approximately 0.3 microns below an elevation of the plane corresponding to the primary surface. In another embodiment, the electronic device further includes a doped semiconductor region adjacent to the tapered portion, wherein a dopant concentration of the doped semiconductor region is greater than a dopant concentration of the semiconductor layer at a location adjacent to the primary surface. The electronic device still further includes an insulating layer disposed between the doped semiconductor region and the conductive electrode, wherein the insulating layer has a first portion and a second portion, and as compared to the second portion of the insulating layer, the first portion of the insulating layer is thinner and disposed closer to the primary surface. In a further embodiment, the tapered shape includes a funnel shape.

In a fourth aspect, a process of forming an electronic device can include providing a semiconductor layer overlying a substrate and having a primary surface, patterning the semiconductor layer to define a trench having a tapered portion, forming a first insulating layer within the tapered portion, and forming a sacrificial plug within the tapered portion. The process can further include removing a first portion of the first insulating layer from the tapered portion, wherein the sacrificial plug substantially protects a second portion of the first insulating layer when removing the first portion of the first insulating layer. The process can still further include removing the sacrificial plug, and forming a conductive electrode at a location from which the sacrificial plug was removed.

In an embodiment of the fourth aspect, the process further includes forming a second insulating layer after removing the portion of the first insulating layer, wherein the second insulating layer is thinner than the first insulating layer. In another embodiment, the process further includes forming a conductive structure, wherein patterning the semiconductor layer includes forming another portion of the trench, wherein the other portion has substantially vertical sidewalls and is disposed below the tapered portion, and forming the conductive structure includes forming the conductive structure within the other portion of the trench before forming the first insulating layer. In a particular embodiment, the process further includes forming a doped semiconductor region adjacent to the tapered portion, wherein forming the doped semiconductor region is performed after forming the conductive structure and before forming the first insulating layer, and a dopant concentration of the doped semiconductor region is greater than a dopant concentration of the semiconductor layer at a location adjacent to the primary surface In a further embodiment, the first and second insulating layers have substantially a same composition.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   providing a semiconductor layer overlying a substrate and having a primary surface;
   patterning the semiconductor layer to define a trench having a tapered portion;
   forming a first insulating layer within the tapered portion;
   forming a sacrificial plug within the tapered portion;
   removing a first portion of the first insulating layer from the tapered portion, wherein the sacrificial plug substantially protects a second portion of the first insulating layer when removing the first portion of the first insulating layer;
   removing the sacrificial plug; and
   forming a conductive electrode at a location from which the sacrificial plug was removed.

2. The process of claim 1, further comprising forming a second insulating layer after removing the portion of the first insulating layer, wherein the second insulating layer is thinner than the first insulating layer.

3. The process of claim 1, further comprising forming a conductive structure, wherein:
   patterning the semiconductor layer comprises forming another portion of the trench, wherein the other portion has substantially vertical sidewalls and is disposed below the tapered portion; and
   forming the conductive structure comprises forming the conductive structure within the other portion of the trench before forming the first insulating layer.

4. The process of claim 3, further comprising forming a doped semiconductor region adjacent to the tapered portion, wherein:
   forming the doped semiconductor region is performed after forming the conductive structure and before forming the first insulating layer; and
   a dopant concentration of the doped semiconductor region is greater than a dopant concentration of the semiconductor layer at a location adjacent to the primary surface.

5. The process of claim 2, wherein the first and second insulating layers have substantially a same composition.

* * * * *